US012748156B2

(12) United States Patent
Bircher

(10) Patent No.: US 12,748,156 B2
(45) Date of Patent: Sep. 29, 2026

(54) BATTERY MANAGEMENT SYSTEM FOR MARINE SEISMIC DEVICES

(71) Applicant: DigiCOURSE, LLC, Harahan, LA (US)

(72) Inventor: Felix Ernest Bircher, Metairie, LA (US)

(73) Assignee: DigiCOURSE, LLC, Harahan, LA (US)

( * ) Notice: Subject to any disclaimer, the term of this patent is extended or adjusted under 35 U.S.C. 154(b) by 0 days.

(21) Appl. No.: 19/331,629

(22) Filed: Sep. 17, 2025

(65) Prior Publication Data

US 2026/0023123 A1 Jan. 22, 2026

Related U.S. Application Data

(62) Division of application No. 19/048,270, filed on Feb. 7, 2025, now Pat. No. 12,422,492.

(Continued)

(51) Int. Cl.

| | |
|---|---|
| ***G01R 31/3842*** | (2019.01) |
| ***G01R 31/367*** | (2019.01) |
| ***G01R 31/371*** | (2019.01) |
| ***G01R 31/392*** | (2019.01) |
| ***G01V 1/38*** | (2006.01) |
| ***G08B 21/18*** | (2006.01) |

(52) U.S. Cl.

CPC ....... *G01R 31/3842* (2019.01); *G01R 31/367* (2019.01); *G01R 31/371* (2019.01);

(Continued)

(58) Field of Classification Search

CPC ......................... G01R 31/3842; G01R 31/367; G01R 31/371; G01R 31/392; G01V 1/3843; G01V 2210/1423; G08B 21/182

See application file for complete search history.

(56) References Cited

U.S. PATENT DOCUMENTS 6,161,495 A * 12/2000 Ambs .................... B63H 21/12 114/337
7,310,287 B2 * 12/2007 Ray ........................ G01V 1/166 367/188

(Continued)

FOREIGN PATENT DOCUMENTS

CN 115621573 A 1/2023
CN 118604654 A 9/2024

OTHER PUBLICATIONS

Search Report and Written Opinion issued for International Patent Application No. PCT/US2025/038499, dated Oct. 7, 2025, 14 pages.

*Primary Examiner* — Tung S Lau
(74) *Attorney, Agent, or Firm* — Haynes and Boone, LLP; Mark A. Tidwell

(57) ABSTRACT

A system and method for monitoring and controlling a plurality of marine seismic devices deployed in a survey operation. A battery monitoring device associated with each marine seismic device monitors one or more battery systems associated with each respective marine seismic device. Each battery monitoring device generates battery data associated with a condition of each battery system and communicates the battery data to a central processor. The central processor analysis the data and identifies individual battery systems or individual marine seismic devices that have anomalous conditions. The anomalous conditions include a battery depletion rate above a threshold or a battery life shorter than the remaining duration of the survey operation. The central processor is configured to generate adjusted control settings for individual marine seismic devices to improve the performance of respective battery systems and to identify whether individual battery systems should be redeployed in a future survey operation or discarded.

21 Claims, 6 Drawing Sheets

Related U.S. Application Data

(60) Provisional application No. 63/674,062, filed on Jul. 22, 2024.

(52) U.S. Cl.
CPC ......... *G01R 31/392* (2019.01); *G01V 1/3843* (2013.01); *G08B 21/182* (2013.01); *G01V 2210/1423* (2013.01)

(56) References Cited

U.S. PATENT DOCUMENTS

| | | | | |
|---|---|---|---|---|
| 8,644,789 | B2 * | 2/2014 | Knoblach | B64B 1/44<br>455/343.1 |
| 9,121,969 | B2 * | 9/2015 | Rigsby | G01V 1/3808 |
| 9,465,078 | B2 * | 10/2016 | Betzner | H01M 10/486 |
| 2008/0106977 | A1 * | 5/2008 | Ray | G01V 1/166<br>367/188 |
| 2013/0257381 | A1 | 10/2013 | Diamond et al. | |
| 2015/0323693 | A1 * | 11/2015 | Rigsby | G01V 1/3808<br>367/15 |
| 2015/0336645 | A1 * | 11/2015 | Brizard | B63G 8/22<br>701/21 |
| 2016/0028238 | A1 * | 1/2016 | Isfeldt | H02J 7/00047<br>320/108 |
| 2016/0056645 | A1 | 2/2016 | Henman et al. | |
| 2017/0315248 | A1 * | 11/2017 | Marc | G01V 1/3852 |
| 2019/0107639 | A1 * | 4/2019 | Moldoveanu | G01V 1/3835 |
| 2023/0054361 | A1 | 2/2023 | Kirchhoff et al. | |

* cited by examiner

BATTERY MANAGEMENT SYSTEM FOR MARINE SEISMIC DEVICES

CROSS-REFERENCE TO RELATED APPLICATIONS

This application is a divisional of U.S. application Ser. No. 19/048,270, filed on Feb. 7, 2025, which claims priority to and the benefit of the filing date of U.S. Provisional Application No. 63/674,062, filed Jul. 22, 2024, the entire disclosures of which are hereby incorporated herein by reference.

FIELD OF THE DISCLOSURE

The present disclosure relates, in general, to systems and methods for monitoring and operating a fleet of marine seismic devices deployed in an array, and more particularly, to systems and methods for monitoring the performance of marine seismic devices deployed in an array and their associated batteries.

BACKGROUND

Battery powered marine seismic devices are commonly used in marine seismic applications for oil and gas exploration, offshore windfarm construction planning, carbon sequestration site surveying and monitoring, as well as other applications. Such battery powered marine seismic devices may be ocean bottom systems, as part of a towed array, as part of an independent swarm array, or a combination of any of the foregoing. The battery powered marine seismic devices may include, for example, depth and lateral control mechanisms for positioning the arrays, systems that measure the speed of arrays as they move through water, heading sensor devices, acoustic ranging devices, mechanisms that control the position of seismic sources, and seabed nodes that record seismic data.

Fleets or arrays of such battery powered marine seismic devices can be quite large, numbering into the hundreds or thousands for a single marine crew and thus use large numbers of batteries, which can be either rechargeable or disposable batteries. Typically, the marine seismic devices are deployed with the intent that they will be inaccessible for long periods of time yet will remain active and operational continuously and uninterruptedly for the entire period. As a non-limiting example, marine seismic arrays are typically deployed for no less than four weeks and may be deployed for up to six months if not longer. Moreover, a marine seismic array typically may take two to three days to deploy and at least one day to retrieve. Finally, a marine seismic array can cost tens to hundreds of thousands of dollars a day to operate. Thus, any delays in the seismic data gathering operation resulting from a depleted battery or a malfunctioning marine seismic device can be very expensive for the operator.

Optimizing the use of these batteries is beneficial for economic, contractual, logistical, and safety reasons. If batteries deplete prematurely in a number of deployed marine seismic devices, it can impact the quality of the seismic data gathered by the array. For example, a marine seismic device with a depleted battery may not be able to maintain a desired vertical or lateral position. Marine seismic devices with prematurely depleted batteries may necessitate recovering the entire array in order to replace the prematurely depleted batteries, leading to delays in survey completion, contractual penalties for such delays. Compounding these problems is the need to transport more batteries (often treated as hazardous cargo) to logistically challenging remote areas of the world. In yet other scenarios, in order to replace depleted batteries, small, manned workboats may be deployed in order to individually replace the depleted batteries, placing personnel at risk and leading to significant economic costs resulting from the additional vessel and crew time.

To avoid these problems, prior art operators will sometimes discard batteries that have useful remaining electrical charge if there is a chance that the batteries might not have sufficient remaining electrical charge to perform for the duration of the next survey. Premature disposal of batteries with some useful remaining electrical charge has a large associated cost in itself, and leads to excessive disposal fees, logistics issues, and waste in the environment.

DETAILED DESCRIPTION

Figure 1:
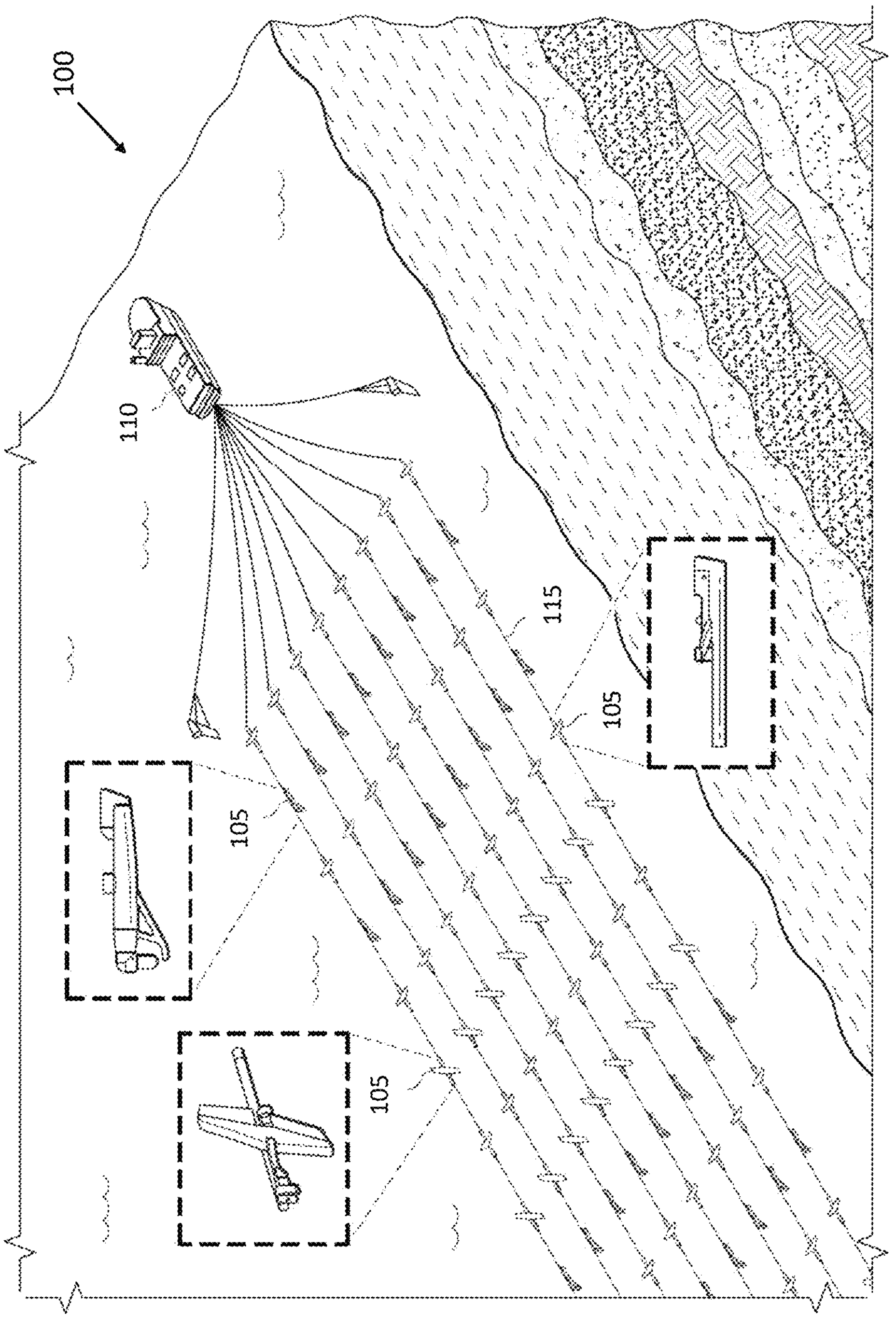
FIG. 1 illustrates a marine seismic array including a survey vessel and a plurality of marine seismic devices, according to one or more embodiments.

The following disclosure provides many different embodiments. Specific examples of components and arrangements are described below to simplify the present disclosure. These are, of course, merely examples and are not intended to be limiting. In addition, the present disclosure may repeat reference numerals and/or letters in the various embodiments. This repetition is for the purpose of simplicity and clarity and does not in itself dictate a relationship between the various embodiments and/or configurations discussed.

Referring to FIG. 1, a marine seismic array 100 is illustrated. The marine seismic array 100 is formed of a multiplicity or plurality of marine seismic devices 105 that are generally operated in conjunction with a survey vessel 110. In one or more embodiments, the survey vessel 110 may be a manned vessel. In one or more other embodiments, the survey vessel 110 may be an unmanned vessel. In some embodiments, the marine seismic devices 105 are buoyant, or semi-buoyant, and may be towed by the survey vessel 110 via one or more streamer cables 115. In some embodiments, the streamer cables 115 are eliminated and the buoyant marine seismic devices 105 are untethered and operate independently as a swarm. In yet other embodiments, the marine seismic devices 105 may be deployed on the ocean bottom as ocean bottom systems.

Figure 2A:
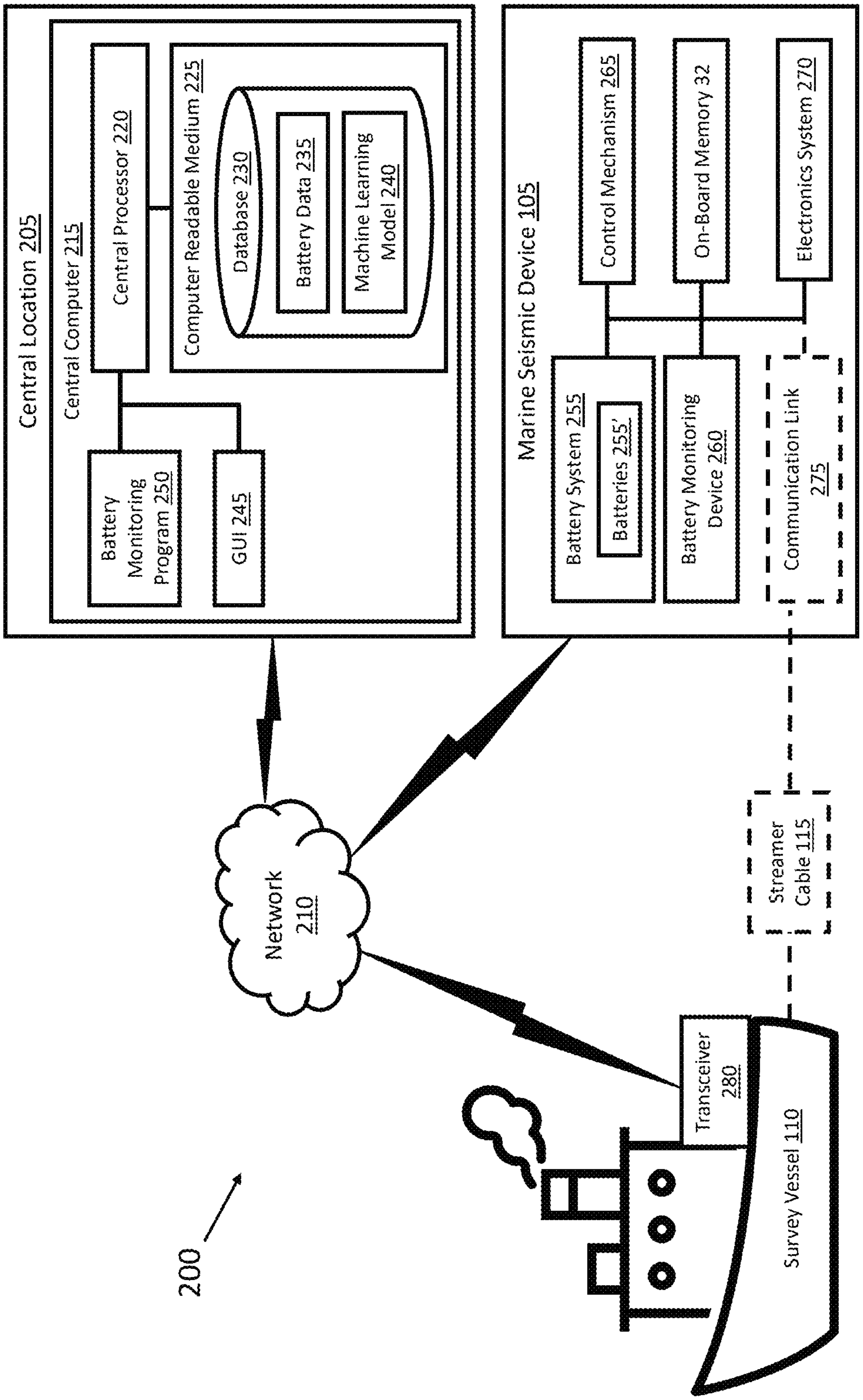
FIG. 2A illustrates a battery monitoring and control system for the plurality of marine seismic devices of the marine seismic array of FIG. 1, according to one or more embodiments.
Figure 2B:
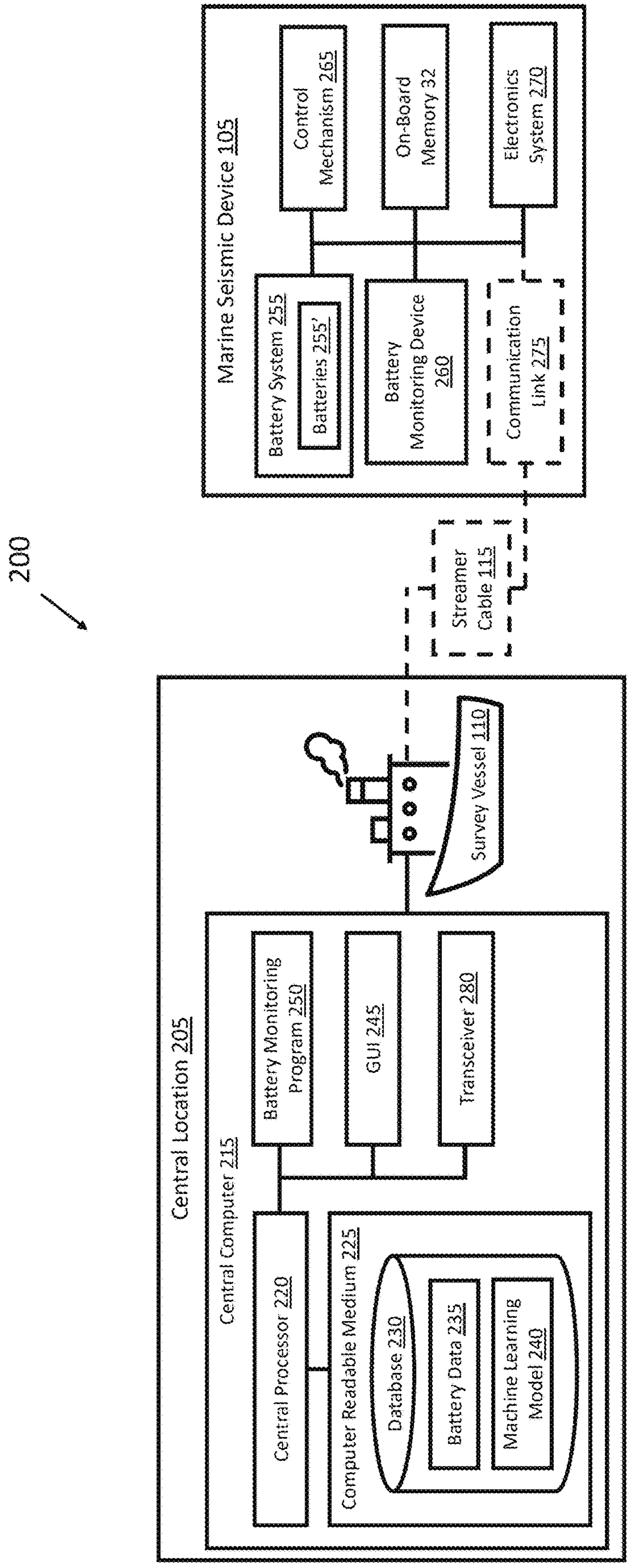
FIG. 2B illustrates another embodiment of the battery monitoring and control system of FIG. 2A, according to one or more embodiments.

Referring to FIGS. 2A and 2B, with continued reference to FIG. 1, a battery management and monitoring system 200 for managing and monitoring battery life and performance of one or more marine seismic devices 105 is illustrated and described, according to one or more embodiments. In one or more embodiments, the battery management and monitoring system 200 includes a survey vessel, such as survey vessel 110, a marine seismic array including a plurality of marine seismic devices, such as marine seismic array 100 including plurality of marine seismic devices 105, and a central location 205.

In one or more embodiments, plurality of marine seismic devices 105, survey vessel 110, and central location 205 are in communication with one another via a network 210. In an example embodiment, the network 210 includes the Internet, one or more local area networks, one or more wide area networks, one or more cellular networks, one or more wireless networks, one or more voice networks, one or more data networks, one or more communication systems, and/or any combination thereof. In some embodiments, the network 210 also includes WIFI, Bluetooth, and Long-Term Evolution ("LTE") or other wireless broadband communication technology.

In one or more embodiments, as shown in FIG. 2A, central location 205 is separate and remote from survey vessel 110 and marine seismic array 100. In one or more other embodiments, as shown in FIG. 2B, the central location 205 is simply remote from the individual marine seismic devices 105 of marine seismic array 100 such that central location 205 is or includes survey vessel 110, which may eliminate the need for network 210 in certain embodiments. In one or more embodiments, central location 205 includes a central computer 215. In one or more embodiments, central computer 215 includes a central processor 220 and a computer readable medium 225 operably coupled thereto. Instructions accessible to, and executable by, central processor 220 are stored on computer readable medium 225. A database 230 is also stored in computer readable medium 225. In one or more embodiments, database 230 may store data, such as battery data 235, and a machine learning model 240. Central computer 215 also includes a graphical user interface ("GUI") 245. In one or more embodiments, the computer may also store an application or program, such as a battery monitoring program 250, which may be executed by the computer using the computer processor. In one or more other embodiments, central location 205 may include a land-based command center, such that central processor 220 is positioned remotely and such that data collected by marine seismic devices 105 is communicated to central processor 220 over network 210.

In one or more embodiments, each marine seismic device 105 of the plurality or multiplicity of marine seismic devices 105 includes an onboard battery system 255 and an onboard battery monitoring device 260. In one or more embodiments, battery system 255 of each marine seismic device 105 may include one or more batteries 255', which may be one or more single-use (i.e., disposable) batteries and/or one or more rechargeable batteries.

In one or more embodiments, where marine seismic devices 105 are buoyant and configured to move through the water (either independently or towed on a streamer cable 115), marine seismic devices 105 further include one or more control mechanisms 265 powered by battery system 255. In one or more embodiments, one or more control mechanisms 265 may include movable wings, rudders, or other similar mechanisms to control vertical and lateral positioning of marine seismic device 105.

In one or more embodiments, each marine seismic device 105 may also include an electronics system 270 powered by the battery system 255. In one or more embodiments, electronics system 270 may include speed sensors to measure the speed of towed arrays through water, heading sensors to measure heading, acoustic ranging devices, seismic sensors, temperature sensors, other types of sensors and/or seismic data recording devices.

In some embodiments, each marine seismic device 105 may also include a communication link 275. In one or more embodiments, where marine seismic array 100 formed by plurality of marine seismic devices 105 is towed, communication link 275 may be a wired communication link such that a wired connection extends along or within the streamer cables 115 between each of plurality of marine seismic devices 105 and survey vessel 110. In one or more embodiments, each streamer cable 115 may connect multiple marine seismic devices 105 to survey vessel 110. In other embodiments, whether the marine seismic devices 105 are towed by streamer cables 115 or not, communication link 275 may be a wireless communication link rather than a wired communication link.

In one or more embodiments, the onboard battery monitoring device 260 of each marine seismic device 105 is integrated with the respective marine seismic device 105 and is in communication with battery system 255 of the marine seismic device 105. In one or more other embodiments, the onboard battery monitoring device 260 of a marine seismic device 105 is integrated with battery system 255 of the marine seismic device 105.

During operation of marine seismic device 105 as part of an array 100, including when marine seismic device 105 is deployed in a survey operation related to oil and gas exploration, the electrical charge of battery system 255 is depleted as the marine seismic device 105 is powered, including powering one or more control mechanisms 265 and electronics system 270. In order to monitor the depletion of battery system 255, battery monitoring device 260 includes coulomb counting circuitry to maintain an accurate count of how much charge a battery has remaining. Moreover, coulomb counting circuitry can be utilized to determine how much power marine seismic device 105 utilizes over a period of time, or in other words, determine the discharge rate of the one or more batteries of battery system 255 of marine seismic device 105 as a result of the load placed on battery system 255 by marine seismic device 105. Based on the discharge rate of the one or more batteries 255' of battery system 255 of marine seismic device 105, a performance of battery system 255 and/or a performance of marine seismic device 105 can be evaluated.

Specifically, the depletion rate and performance of each battery system 255 of each marine seismic device 105 of marine seismic array 100 deployed in a survey operation over a period of time can be monitored and evaluated in comparison to the depletion rate and performance of the overall array 100 to make certain determinations about individual battery systems 255 of individual marine seismic devices 105. In one or more embodiments, the determination may be whether a battery system 255 will have sufficient charge to complete the survey operation in which a respective marine seismic device 105 is deployed, based on a remaining time period identified for the survey operation in which the respective marine seismic device 105 is deployed, or whether the battery system 255 will fully deplete prior to completion of the survey operation and require retrieval of the respective marine seismic device 105. In one or more embodiments, the determination may be whether a battery system 255 will have sufficient charge such that the battery system 255 of the respective marine seismic device 105 can be retained, as opposed to being discarded, for redeployment in a future survey operation where an expected battery charge to be depleted during the redeployment in the future survey operation is less than the remaining charge of the battery system 255. In one or more embodiments, the determination may be whether a marine seismic device 105 is operating in accordance with expected operating parameters or in accordance with a majority of the other marine seismic devices 105 of the array 100.

In one or more embodiments, the discharge rate of an individual battery system 255 can be compared to an average discharge rate of the plurality of battery systems 255 utilized in marine seismic array 100 over a period of time to determine if the discharge rate of the individual battery system 255 is consistent with the average discharge rate of the plurality of battery systems 255 in marine seismic array 100. Likewise, the discharge rate of an individual battery system 255 can be compared to an average discharge rate of the plurality of battery systems 255 utilized in marine seismic array 100 over a period of time to determine if the respective marine seismic device 105 associated with the individual battery system 255 is operating in a manner that is consistent with the plurality of marine seismic devices 105 in the marine seismic array 100.

In one or more embodiments, battery monitoring device 260 may monitor an amperage and voltage drawn from battery system 255 as a result of a load placed on battery system 255. Battery monitoring device 260 collects battery data 235 associated with a monitored condition of battery system 255 and communicates or transmits the collected battery data 235 to a central location 205 remote from the individual marine seismic devices 105 for processing and/or analysis. Such remote central location 205 may be onboard survey vessel 110, or on another nearby marine vessel (not shown) or at another location removed from the array 100. Such central location 205 may include at least a central processor 220 for executing the analysis described herein, and may also include a database 230. Monitored conditions of a battery system 255 can include, but are not limited to, battery capacity, battery life, or battery depletion rate. In one or more embodiments, monitored conditions of a battery system 255 can include, but are not limited to, a value associated with battery capacity, battery life, or battery depletion rate. In this regard, a condition of a battery system 255 may be a value or value range representing the condition.

In one or more embodiments, marine seismic device 105 communicates or transmits battery data 235 related to a monitored battery system condition to central location 205 via network 210. In one or more embodiments, marine seismic device 105 may include a control unit in communication with battery monitoring device 260. In such embodiments, the control unit may communicate or transmit battery data 235 collected by the battery monitoring device 260 to central processor 220. In one or more embodiments, each marine seismic device of the plurality of marine seismic devices 105 in the marine seismic array 100 communicates or transmits battery data 235 to the central location 205 via network 210. Using the central computer 215, the transmitted battery data 235 from each of the plurality of marine seismic devices 105, or from each marine seismic device of a portion of the plurality of marine seismic devices 105, may be averaged to determine an average condition of each battery system 255 of each marine seismic device of the plurality of marine seismic devices 105, or of each battery system 255 of each marine seismic device of the portion of the plurality of marine seismic devices 105. In one or more embodiments, the transmitted battery data 235 may be averaged to determine an average value associated with the average battery capacity, battery life, or battery depletion rate of the battery systems 255 of the plurality of marine seismic devices 105. In one or more embodiments, using the central computer 215, the transmitted battery data 235 from each of the plurality of marine seismic devices 105, may be used to calculate or generate a set of marine seismic survey device power consumption statics, which may provide a statistical analysis of the monitored conditions of each battery system 255 deployed in the marine seismic array 100.

In one or more embodiments, marine seismic device 105 may communicate collected battery data 235 to survey vessel 110 via communication link 275. In embodiments where communication link 275 includes a wired connection, marine seismic device 105 may communicate collected battery data 235 to survey vessel 110 via streamer cables 115. In embodiments where communication link 275 includes a wireless connection, marine seismic device 105 may communicate collected battery data 235 to survey vessel 110 wirelessly via network 46. In one or more embodiments, survey vessel 110 may include a transceiver 280 to facilitate communication with marine seismic devices 105, network 210, and central processor 220. In one or more embodiments, survey vessel 110 may receive battery data 235 from each of marine seismic device 105 via transceiver 280. In one or more embodiments, survey vessel 110 may communicate or transmit battery data 235 to central computer 215 via transceiver 280.

In one or more embodiments, the communication link 275 communicatively couples the marine seismic device 105, and the battery monitoring device 260, to the central processor 220. In one or more embodiments, the communication link 275 may be a hard wire connection, an inductively coupled connection, an acoustic link, an optical link, a radio frequency link, or some combination of these methods. In one or more embodiments, each communication link 275 individually couples each respective marine seismic device 105 to the central processor 220. In one or more embodiments, one communication link 275 may communicatively couple all marine seismic devices 105 on a single streamer cable 115 to the central processor 220. In one or more embodiments, where central location 205 is or includes survey vessel 110, central processor 220 is positioned locally on survey vessel 110 and is directly connected to communication link 275 associated with the plurality of marine seismic devices 105.

In one or more embodiments, communication link 275 allows for instantaneous or real-time collection and transmission of battery data 235 such that instantaneous or real-time determinations of battery charge or discharge rate for each battery system 255 of each marine seismic device 105 of the deployed array 100 can be made, and such that instantaneous or real-time determinations of an average condition, which may include an average battery charge or discharge rate, for the entire marine seismic array 100 can be made. In one or more other embodiments, each marine seismic device 105 may include on-board memory 285 to record a current charge and/or the discharge rate of the battery system 255 for comparison with the current charge and/or the discharge rate of the battery systems 255 of the entire marine seismic array 100 upon completion of the survey operation when the marine seismic array 100 is retrieved.

Historically, it has been difficult to predict remaining or residual battery life with high accuracy ahead of a future survey operation because battery depletion (or consumption) is highly variable and dependent on a number of factors. For example, inconsistencies between marine seismic devices 105 of the same type will cause variations in the rates of depletion of battery systems 255 associated with those marine seismic devices 105. Likewise, the environment in which marine seismic devices 105 of marine seismic array 100 are deployed can impact battery depletion. For example, depth or lateral control mechanisms 265 positioned along streamer cables 115 towed behind survey vessel 110 or seismic source devices in rough seas may require additional power for operation of their associated control mechanisms 265 to ensure a desired orientation. Other operating or environmental conditions that could require additional power usage of control mechanism 265 include circumstances where: the depth of streamer cable 115 is shallow and thus more highly influenced by surface sea state; marine seismic array 100 is subject to large cross current; the survey operation requires repeating the positions of an irregular prior survey operation, and other such circumstances. Similarly, electronic systems 270 during a particular deployment may utilize more power, such as where a survey design requires more frequent acoustic ranging, or where environmental conditions lead to more frequent acoustic "re-tries" because the environmental conditions make obtaining an accurate range on the first try difficult. Water temperature can also affect battery discharge, as can longer recording intervals for marine seismic devices 105. As will be discussed in more detail below, battery data 235 collected by battery monitoring device 260 and transmitted to central processor 220 where the transmitted battery data is used to analyze a condition of the battery systems 255 of the marine seismic devices 105 of the array 100, such as rates of battery depletion for plurality of marine seismic devices 105 in marine seismic array 100. This analysis, in turn, may be used to more accurately predict the remaining battery life of each battery system 255 of the array 100.

As used herein, "marine seismic device" and "marine seismic survey device" means any type of equipment utilized to conduct a marine seismic survey, including without limitation, birds for controlling the depth or lateral position of towed cables, transducers, hydrophones, sonobuoys, acoustic receivers, signal sources or other equipment utilized in a seismic survey and that are individually powered by a depletable power source such as batteries. As used herein, reference to the "same type" of marine seismic device and marine seismic survey device means that the plurality of marine seismic devices from which a set of marine seismic device power consumption statistics are determined generally all have the same physical and electrical features so that the power consumption across the "same type" of devices will all be similar. In one non-limiting example, the marine seismic devices used for the statistic calculation may all be birds for controlling the depth or lateral position of towed cables. In another non-limiting example, the marine seismic devices used for the statistic calculation may all be transducers. In other embodiments, the methods described herein may be used for different sets of marine seismic devices all deployed as part of the same array. For example, in one or more embodiments, the array may include a plurality of marine seismic devices. A first portion of the plurality of marine seismic devices may be a first type of marine seismic device, and a second portion of the plurality of marine seismic devices may be a second type of marine seismic device that is different from the first type of marine seismic device. in one or more embodiments, the first portion of the plurality of marine seismic devices may include at least one marine seismic device that is a first type of marine seismic device, and a second portion of the plurality of marine seismic devices may include at least one marine seismic device that is a second type of marine seismic device that is different from the first type of marine seismic device. Utilizing the above examples, marine seismic device power consumption statistics for all of the birds in an array may be calculated, and likewise, marine seismic device power consumption statistics for all of the transducers in the same array may be calculated and used to evaluate the respective battery systems and/or marine seismic devices. Finally, while described in terms of a marine seismic survey, the seismic equipment and methods for management may also apply equally to land based seismic devices deployed in an array and individually powered by a depletable power source such as batteries.

In one or more embodiments, central processor 220 receives battery data 235 collected by battery monitoring device 260 and associated with the respective battery system 255 of each marine seismic device 105 of the marine seismic array 100. In one or more embodiments, battery data 235 may be associated with a battery charge, including remaining battery capacity, of battery system 255, or a battery depletion rate of battery system 255. Central processor 220 includes and executes battery monitoring program 250 to process and analyze transmitted battery data 235. In one or more embodiments, battery monitoring program 250 is executed by central processor 220 to initiate data collection by the plurality of battery monitoring devices 260. In one or more embodiments, central processor 220 characterizes or averages battery data 235 across plurality of marine seismic devices 105 of marine seismic array 100 to determine an overall battery performance for the marine seismic array 100. In one or more embodiments, central processor 220 characterizes or averages battery data 235 across marine seismic devices 105 of the same type with respect to the marine seismic array 100 to determine an average condition or an overall battery performance for marine seismic devices 105 of the same type. In some embodiments, there is only one type of battery-powered marine seismic device 105 in marine seismic array 100. In other embodiments, there are two or more different types of marine seismic devices 105 in marine seismic array 100. For example, in one or more embodiments, the marine seismic array 100 may include the plurality of marine seismic devices 105. A first portion of the plurality of marine seismic devices 105 may be a first type of marine seismic device, and a second portion of the plurality of marine seismic devices 105 may be a second type of marine seismic device that is different from the first type of marine seismic device.

After analyzing transmitted battery data 235 collected from the plurality of marine seismic devices 105, central processor 220 compares the battery performance, such as the remaining battery capacity or the battery depletion rate, of each individual marine seismic device 105 to the average condition or the average performance of the plurality of marine seismic devices 105 of the marine seismic array 100 to identify a condition anomaly within an individual battery system 255 or an individual marine seismic device 105. In one or more embodiments, central processor 220 compares the battery depletion rate of the respective battery system 255 of each individual marine seismic device 105 of marine seismic array 100 to the average condition or the average battery depletion rate of the plurality of battery systems 255 of the plurality of marine seismic devices 105 of the marine seismic array 100. In one or more embodiments, central processor 220 compares the battery depletion rate of the respective battery system 255 of each individual marine seismic device 105 of marine seismic array 100 to the average battery depletion rate of the plurality of battery systems 255 of the same type of marine seismic device 105 in marine seismic array 100.

In one or more embodiments, if the battery depletion rate of the respective battery system 255 of an individual marine seismic device 105 significantly exceeds the average battery depletion rate of the battery systems 255 of the plurality of marine seismic devices 105 in the marine seismic array 100, or exceeds a calculated or predefined threshold relative to, or independent of, the average battery depletion rate, that individual battery system 255 or individual marine seismic device 105 is identified as an anomaly. In some embodiments, the battery depletion rate of the respective battery system 255 of an individual marine seismic device 105 falling significantly below the average battery depletion rate of the plurality of marine seismic devices 105 of marine seismic array 100, or below a calculated or a predefined threshold relative to, or independent of, the average battery depletion rate, may also cause that individual battery system 255 or marine seismic device 105 to be identified as an anomaly. Devices with such anomalous battery depletion rates may indicate an electronic or mechanical fault within marine seismic device 105 or the battery system 255, improper control settings for marine seismic device 105, possible rigging/ballast problems on the section of streamer cable 115 on which marine seismic device 105 is installed, a malfunctioning control mechanism 265, or a malfunctioning battery system 255.

In one or more embodiments, after averaging battery data 235 collected from each of the plurality of marine seismic devices 105 in the marine seismic array 100, central processor 220 determines a threshold condition that is based on the averaged battery data. The threshold condition may be represented as a value or range of values. Falling above or below the threshold condition or value, depending upon what battery system condition or transmitted battery data 235 is being analyzed, triggers the identification of a condition anomaly. Generally, the battery system condition of the majority of marine seismic devices 105 of the array 100 will fall on one side of the threshold, and a battery system condition this is anomalous will fall on the opposite side of the threshold. For example, where the battery depletion rate of the plurality of battery systems 255 is the battery system condition being analyzed, if the battery depletion rate of a respective battery system 255 of an individual marine seismic device 105 exceeds the determined threshold condition or value, that battery system 255 or marine seismic device 105 is identified as an anomaly in comparison to the majority of the marine seismic devices 105 making up the array 100 which have a depletion rate falling below the threshold.

In one or more embodiments, after averaging battery data 235 collected from each marine seismic device of a first portion of the plurality of marine seismic devices 105, where each marine seismic device of the first portion of the plurality of marine seismic devices is a first type of marine seismic device, central processor 220 determines a first threshold condition that is based on the averaged battery data of the first portion of the plurality of marine seismic devices 105. In one or more embodiments, after averaging battery data 235 collected from each marine seismic device of a second portion of the plurality of marine seismic devices 105, where each marine seismic device of the second portion of the plurality of marine seismic devices is a second type of marine seismic device that is different from the first type of marine seismic device, central processor 220 determines a second threshold condition that is based on the averaged battery data of the second portion of the plurality of marine seismic devices 105. The first and second threshold conditions may be represented as a value or range of values, such as, for example, a first threshold value and a second threshold value.

In one or more embodiments, central processor 220 averages the battery depletion rate of the plurality of battery systems 255 of the plurality of marine seismic devices 105 of the marine seismic array 100 relative to the respective electrical loads placed across each marine seismic device 105 or each battery system 255. Central processor 220 then determines a threshold value, as described above, and compares the average battery depletion rate relative to electrical load to the battery data 235 or individual battery performance of each individual marine seismic device 105. If the battery depletion rate relative to electrical loading of the respective battery system 255 of an individual marine seismic device 105 exceeds the determined threshold value, that battery system 255 or marine seismic device 105 is identified as an anomaly.

In one or more embodiments, central processor 220, based on the analysis of the battery depletion rates of the respective battery system 255 of each marine seismic device 105 in marine seismic array 100, calculates an estimated or expected remaining battery life for each battery system 255 or each marine seismic device 105.

In one or more embodiments, central processor 220 tracks the completion date of an ongoing or present survey operation in which the plurality of marine seismic devices are deployed.

In one or more embodiments, where the expected remaining battery life for each marine seismic device 105 is calculated during the present survey operation, central processor 220 may compare the determined remaining battery life of each marine seismic device 105 in the marine seismic array 100 to a remaining duration, or remaining time period, of the present survey operation and identify any individual marine seismic device 105 that is estimated to fully deplete its respective battery system 255 prior to the completion of the present survey operation. Such an analysis performed by central processor 220 helps alert operators to potential problems and maintenance that may be required during the present survey operation. This advanced notice of impending downtime and maintenance gives operators and crews time to plan for and schedule the required maintenance to make the process as efficient as possible and prevents a surprise shutdown due to a sudden failure of one or more of the marine seismic devices 105.

In one or more embodiments, central processor 220 may calculate the expected remaining battery life for each marine seismic device 105 of the plurality of marine seismic devices 105 of marine seismic array 100 upon the completion of a survey operation. In one or more embodiments, central processor 220 generates a report identifying the expected remaining battery life of each marine seismic device 105 in marine seismic array 100. In one or more embodiments, central processor 220 may use this report, as well as information regarding a future survey operation, including a maximum deployment duration or maximum deployment time period, to determine whether each individual battery system 255 of the plurality of marine seismic devices 105 should be redeployed in the future survey operation or replaced before commencing the future survey operation. Such marine seismic devices 105 that have completed a survey operation, or been retrieved during a survey operation, and which may be evaluated to determine whether each individual battery system 255 may be redeployed in a future survey operation, may be referred to as serviced marine seismic devices in one or more embodiments. In one or more embodiments, for example, the report may facilitate the assembly of a plurality of serviced marine seismic device that have sufficient remaining battery life to be redeployed in a future survey operation, facilitate removing serviced marine seismic devices that have a remaining battery life less than a maximum deployment duration of a future survey operation, and/or facilitate replacing the battery or battery system of each serviced marine seismic device that has a remaining battery life less than a maximum deployment duration of a future survey operation.

For example, if the estimated remaining battery life of a particular battery system 255 of a particular marine seismic device 105 is estimated by central processor 220 to deplete before the completion of the future survey operation, or in other words the estimated remaining battery life is less than a maximum deployment duration of the future survey operation, central processor 220, or the report generated by central processor 220, would indicate that the battery system 255, or one or more of the components of the battery system 255, of that particular marine seismic device 105 should be replaced and should not be redeployed in the further survey operation. Such determinations help avoid wasting batteries that could still be used for another survey operation and simultaneously help reduce the incidence of marine seismic device failures due to complete battery depletion during a survey operation.

In one or more embodiments, central processor 220 uses the expected remaining battery life information and the average battery depletion rate of the plurality of battery systems 255 of each type of marine seismic devices 105 to recalculate the expected remaining battery life of an individual battery system 255 if that battery system 255 were to be redeployed in a different type of marine seismic device 105. For example, the central processor 220 may determine that a partially depleted battery system 255 currently located in a high-depletion rate marine seismic device does not have sufficient battery capacity or battery life to be redeployed in that same high-depletion rate marine seismic device for a future survey operation. However, based on the calculated average battery depletion rate of battery systems 255 being used in different, low-depletion rate marine seismic devices, central processor 220 can determine whether the partially depleted battery system 255 previously used in the high-depletion rate marine seismic device would have sufficient expected remaining battery capacity or battery life to be redeployed in the low-depletion rate marine seismic device for the future survey operation and be able to complete the future survey operation.

As used herein, "high-depletion rate marine seismic device" and "low-depletion rate marine seismic device" are relative to the other types of marine seismic devices that make up the marine seismic array. When the average battery depletion rate for each different type of marine seismic device is calculated or determined, different types of marine seismic devices will typically have different average battery depletion rates. Determining which type of marine seismic device is a "high-depletion rate marine seismic device" or "low-depletion rate marine seismic device" for purposes of this example is determined by comparing the average battery depletion rate of each type of marine seismic device to the other types of marine seismic devices.

In one or more embodiments, central processor 220 utilizes a machine learning model, such as machine learning model 240, to update and improve its analyses. In one or more embodiments, machine learning model 240 is stored on the database 230 in communication with central processor 220. In some embodiments, central processor 220 utilizes machine learning model 240 to recalculate or adjust estimated remaining battery life or battery capacity determinations made at the end of a survey operation to account for environmental conditions and survey configuration settings expected in a future survey operation. In most cases, the environmental conditions and survey configuration settings will change from one survey operation to the next. As discussed above, these factors can affect the battery depletion rate of the battery systems in the marine seismic devices used during the survey operation. Thus, being able to recalculate or adjust the estimated remaining battery life or battery capacity determinations of the battery systems to account for such changes that will affect the rate of depletion of the battery systems further promotes efficient use of the battery systems and reduces the incidence of complete battery system depletion during a survey operation.

In one or more embodiments, central processor 220 uses battery data 235 collected from the plurality of marine seismic devices 105 during a survey operation to calculate an estimated remaining battery life or remaining battery capacity of the respective battery system 255 of each marine seismic device 105 in use and identify individual marine seismic devices 105 that may completely deplete their respective battery systems 255 before the completion of the survey operation. In such embodiments, central processor 220 may also generate recommended configuration (or operating parameter) changes for any one or more of the marine seismic devices 105, including the marine seismic devices 105 identified as likely to completely deplete their respective battery systems 255 prior to the completion of the survey operation. The recommended configuration changes may be generated for the marine seismic devices 105 identified as likely to completely deplete their respective battery systems 255 prior to the completion of the survey operation in order to reduce the rate of depletion of their respective battery systems 255 so that those battery systems 255 may last for the entire duration of the present survey operation. The recommended configuration changes can be communicated from central processor 220 to the individual marine seismic devices 105 via the communication links 275. In one or more embodiments, the recommended configuration changes may be communicated to the additional control unit of the individual marine seismic devices 105, where present, to execute and implement the recommended configuration changes.

Any one or more of the calculations, determinations, reports, and alerts described above may be displayed or otherwise provided to operators and crew members via GUI 245 associated with central processor 220. GUI 245 may be located locally on survey vessel 110 or remotely at central location 205, including a land-based command center. GUI 245 may display the reports, including the estimated remaining battery life of each battery system 255 in marine seismic array 100. GUI 245 may display this information continuously, periodically, on-demand, or in the event of an emergency or an anomaly that requires immediate attention. GUI 245 may highlight or otherwise alert operators to individual marine seismic devices 105 that have been identified as having an anomalous condition, include having higher than average battery depletion rates or having a respective battery system 255 that is estimated to be completely depleted prior to the completion of the survey operation. GUI 245 may also display a report of the estimated remaining battery life of each marine seismic device 105 at the completion of a survey operation to enable operators to make decisions regarding redeploying or replacing the battery systems 255 or one or more components of the battery systems 255.

In one or more embodiments, one or more visible and/or audible indicators may be positioned on or around GUI 245, survey vessel 110, and or central location 205, including a command center, to alert operators or crew members to a marine seismic device 105 that has an anomalous condition.

Figure 3:
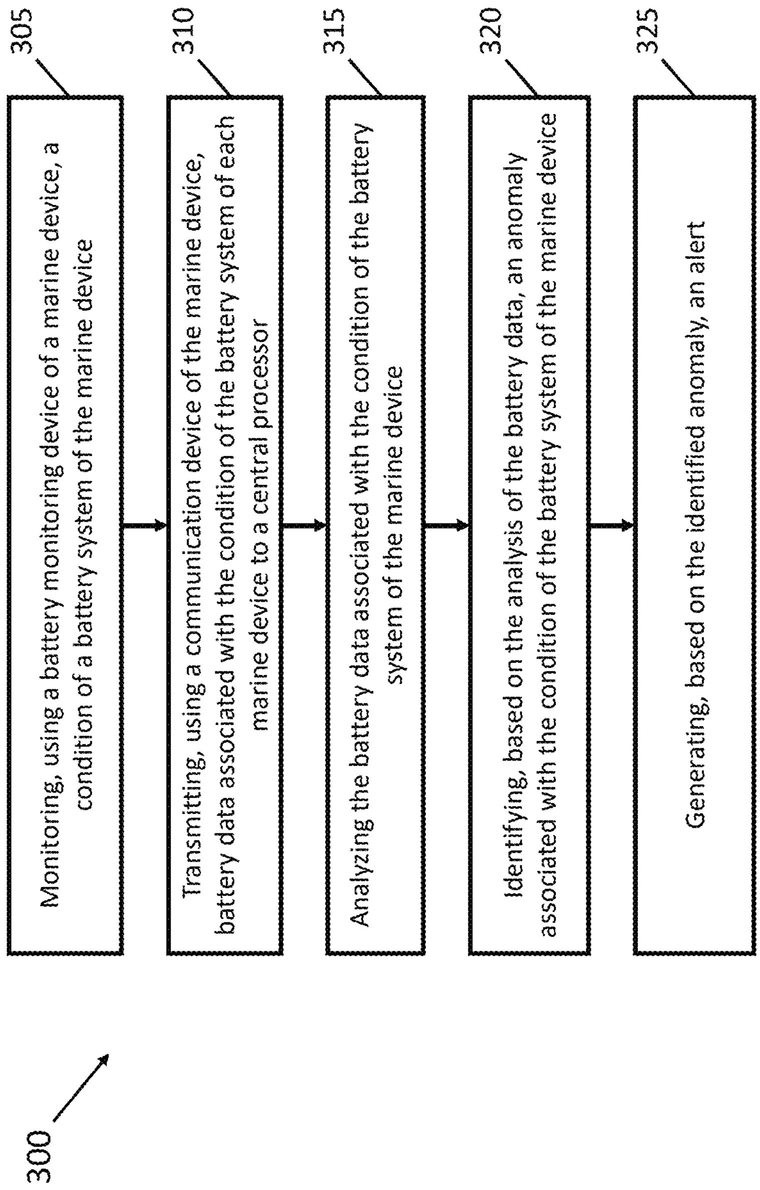
FIG. 3 illustrates a method of operating the battery monitoring and control system of FIG. 2A and/or FIG. 2B, according to one or more embodiments.

FIG. 3 illustrates a method 300 of operating a battery monitoring and control system for monitoring a condition of a battery system of a marine seismic device in a marine seismic array deployed in a survey operation, according to one or more embodiments. In one or more embodiments, the battery monitoring and control system may be battery monitoring and control system 200, the battery system may be battery system 255, the marine seismic device may be marine seismic device 105, and the marine seismic array may be marine seismic array 100. As described above, in one or more embodiments, battery monitoring system 200 is configured to utilize a battery monitoring device, such as battery monitoring device 260, associated with each marine seismic device 105 in marine seismic array 100 to monitor a battery system condition, such as battery capacity, battery life, or battery depletion rate, of each battery system 255 of each marine seismic device 105 and to identify individual battery systems 255 or individual marine seismic devices 105 with an anomalous condition.

In one or more embodiments, each respective battery monitoring device 260 collects battery data, such as battery data 235, associated with the battery system condition of each respective battery system 255 of each respective marine seismic device 105. In one or more embodiments, battery data 235 associated with each respective battery system 255 is transmitted to a central computer at a central location, such as central computer 215 at central location 205, for processing and analyzing. In one or more embodiments, central computer 205, using one or more processors, such as central processor 220, averages the transmitted battery data 235 for the entire marine seismic array 100. In one or more embodiments, central processor 220 then compares each individual battery data 255 for each individual battery system 255 to the averaged battery data. In one or more embodiments, based on the comparisons of each individual battery data 255 to the averaged battery data, central processor 220 is configured to identify individual battery systems 255 or individual marine seismic devices 105 that have anomalous conditions relative to the other battery systems 255 or marine seismic devices 105 in marine seismic array 100. In one or more embodiments, based on the analyses and comparisons of battery data 255, central processor 220 may determine whether each individual battery system 255 has sufficient battery capacity or battery life to complete an ongoing survey operation in which it is deployed or to complete a future survey operation if each individual battery system 255 were to be redeployed in the same or a different marine seismic device 105. In one or more embodiments, central processor 220 may execute a battery monitoring program, such as battery monitoring program 250, stored on central computer 215 to execute the steps outlined above and presented below. In one or more embodiments, central processor 220 may utilize a machine learning model, such as machine learning model 240, to analyze transmitted battery data 235, identify anomalous conditions, anomalous battery systems 255 or anomalous marine seismic devices 105, and determine whether each individual battery system 255 has sufficient battery capacity or battery life to complete an ongoing survey operation in which it is deployed or to complete a future survey operation if each individual battery system 255 were to be redeployed in the same or a different marine seismic device 105.

In step 305, a condition of each battery system 255 of each marine seismic device 105 is monitored or measured using each respective battery monitoring device 260 associated with each marine seismic device 105. Specifically, each respective battery monitoring device 260 collects battery data 235 associated with each respective marine seismic device 105 and associated with a remaining battery capacity, a remaining battery life, or a battery discharge rate of each respective battery system 255. In one or more embodiments, each marine seismic device 105 of the marine seismic array 100 is deployed and operated over a period of time to collect seismic data.

In step 310, battery data 235 associated with each of the plurality of marine seismic devices 105 in marine seismic array 100 is transmitted or communicated to central processor 220 or central computer 215 at central location 205. Specifically, battery data 235 may be transmitted wirelessly via communication link 275 of each respective marine seismic device 105 and/or via network 210. In one or more embodiments, battery data 235 may also be transmitted in a wired configuration from marine seismic devices 105 to survey vessel 110 via streamer cables 115. In one or more embodiments, central location 205 may include survey vessel 110 and thus central computer 215 may be positioned on survey vessel 110. In still other embodiments, where central location 205 is remote from survey vessel 110, survey vessel 110 may include transceiver 280 to transmit battery data 235 received from each marine seismic device 105 to central computer 215, which thereafter may be referred to as transmitted battery data 235. In one or more embodiments, battery power consumption is monitored for each marine seismic device 105 of the marine seismic array 100 deployed and operated over the period of time.

In step 315, battery data 235 is analyzed using central processor 220. Specifically, central processor 220 averages battery data 235 for the entire marine seismic array 100. Central processor 220 then compares each individual battery data 235 for each individual battery system 255 to the averaged battery data. In one or more embodiments, a set of marine seismic survey device power consumption statistics, which is associated with a condition of the battery system 255 of each marine seismic device 105 of the marine seismic array 100 deployed and operated over the period of time, is calculated.

In step 320, central processor 220 identifies individual battery systems 255 or individual marine seismic devices 105 with an anomalous condition based on the analysis of battery data 235 in step 315. Specifically, central processor 220 compares each individual battery data 255 to the averaged battery data to identify individual battery systems 255 or individual marine seismic devices 105 that have anomalous conditions relative to the other battery systems 255 or marine seismic devices 105 in marine seismic array 100. In one or more embodiments, central processor 220 may determine whether each individual battery system 255 has sufficient battery capacity or battery life to complete an ongoing survey operation in which it is deployed or to complete a future survey operation if each individual battery system 255 were to be redeployed in the same or a different marine seismic device 105. In one or more embodiments, central processor 220 may identify individual battery systems 255 or individual marine seismic devices 105 that have a battery depletion rate that exceeds a calculated or predetermined threshold condition or value above the average battery depletion rate of the marine seismic array 100, which is indicative of an anomalous condition.

In step 325, an alert is generated by central processor 220 based at least in part on the identified anomalous condition associated with one or more battery systems 255 or marine seismic devices 105. Specifically, the alert may be displayed via GUI 245 and may indicate whether each battery system 255 has sufficient charge to complete an ongoing survey operation in which respective marine seismic device 105 is deployed, or whether battery system 255 will fully deplete prior to completion of the survey operation and require retrieval of respective marine seismic device 105. In one or more embodiments, the alert may indicate whether each individual battery system 255 has sufficient battery capacity or battery life to complete an ongoing survey operation in which it is deployed or to complete a future survey operation if each individual battery system 255 were to be redeployed in the same or a different type of marine seismic device 105. In one or more embodiments, the alert may indicate recommended adjustments (or "recommended survey configuration adjustments") to control mechanisms 265 of marine seismic devices 105 that will reduce the battery depletion rate and increase the battery life of the battery systems 255 of the marine seismic devices 105.

Figure 4:
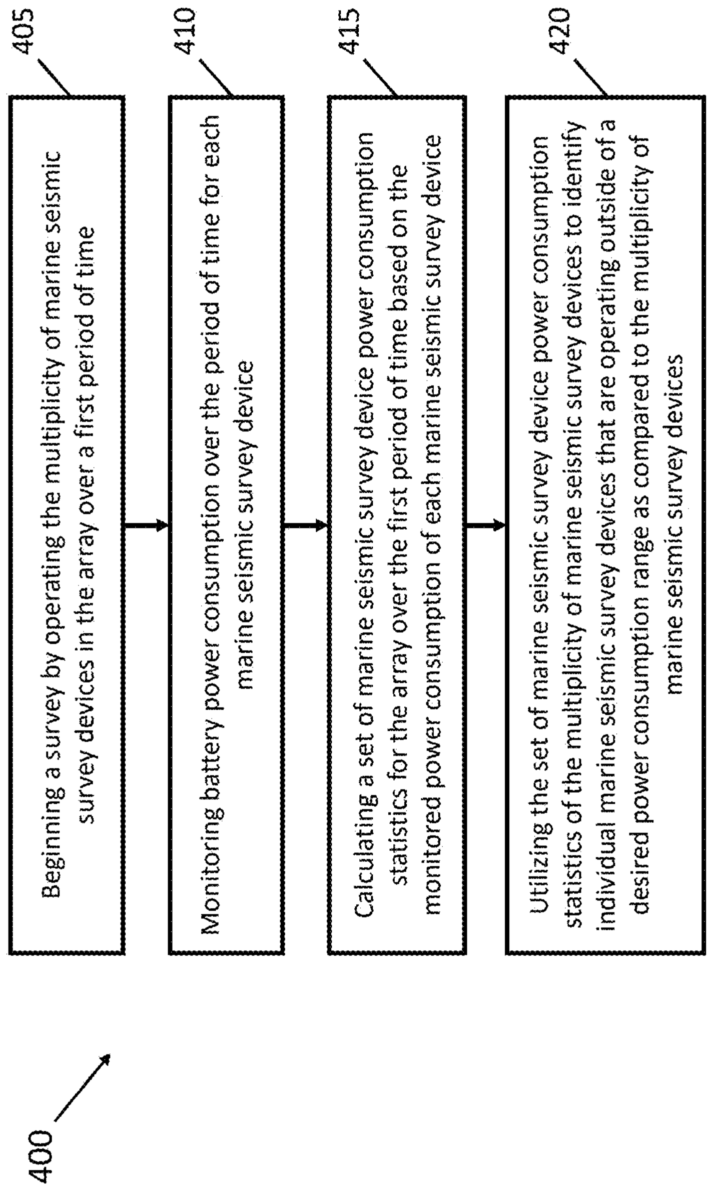
FIG. 4 illustrates a method for conducting a seismic data collection survey using the marine seismic array of FIG. 1, according to one or more embodiments.

FIG. 4 illustrates a method 400 for conducting a seismic data collection survey, according to one or more embodiments. At step 405, a survey is begun by operating the multiplicity of marine seismic survey devices in the array over a first period of time. At step 410, battery power consumption over the period of time for each marine seismic survey device is monitored. At step 415, a set of marine seismic survey device power consumption statistics for the array over the first period of time based on the monitored power consumption of each marine seismic survey device is calculated. At step 420, the set of marine seismic survey device power consumption statistics of the multiplicity of marine seismic survey devices is utilized to identify individual marine seismic survey devices that are operating outside of a desired power consumption range as compared to the multiplicity of marine seismic survey devices.

Figure 5:
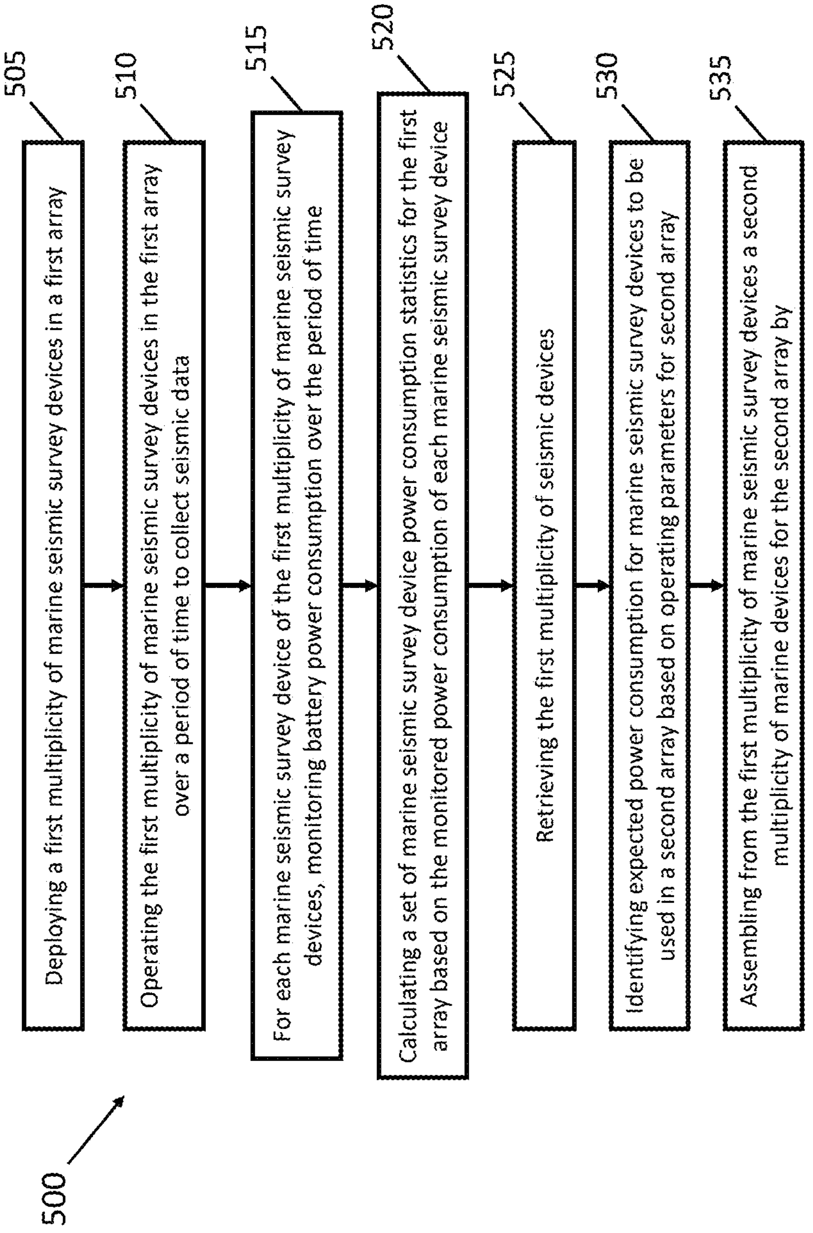
FIG. 5 illustrates a method for seismic data collection using the marine seismic array of FIG. 1, according to one or more embodiments.

FIG. 5 illustrates a method 500 for seismic data collection, according to one or more embodiments. At step 505, a first multiplicity of marine seismic survey devices is deployed in a first array. At step 510, the first multiplicity of marine seismic survey devices is operated in the first array over a period of time to collect seismic data. At step 515, for each marine seismic survey device of the first multiplicity of marine seismic survey devices, battery power consumption over the period of time is monitored. At step 520, a set of marine seismic survey device power consumption statistics is calculated for the first array based on the monitored power consumption of each marine seismic survey device. At step 525, the first multiplicity of seismic devices is retrieved. At step 530, expected power consumption for marine seismic survey devices to be used in a second array based on operating parameters for second array is identified. At step 535, a second multiplicity of marine seismic devices for the second array is assembled from the first multiplicity of marine seismic survey devices.

It will be appreciated that underwater marine battery management systems present unique obstacles, particularly when used in a large array of marine seismic devices deployed in the water (either floating or submerged) as part of a seismic survey that may be deployed for weeks or months at a time. The batter systems of such marine seismic devices are not readily accessible for obtaining battery and operating data, nor are the marine seismic devices easily observed to determine operating behavior. Similarly, communications with such marine seismic devices is difficult based on the sheer size of the array, which typically may range from one to three miles long, but may be as long as 7 miles inhibiting communications through radio or optical pathways. In one or more embodiments, a preferred solution to the communication issue for towed arrays is realized by the use of a hardwired communication link back to a central location made possible by the fact that the array is cabled together for towing purposes.

An additional obstacle faced with such large arrays of marine seismic devices is that the array, being miles long is also subject to tens of tons of inertia. Thus, if a battery fully depletes or otherwise depletes in an unexpected way during a survey operation, the result is significant logistical challenges to identify and replace the marine seismic device. Unlike aerial drones, marine seismic devices such as those described herein cannot be programmed to land in safe and convenient locations as the batteries approach full depletion. And unlike a land device or system, the marine seismic devices do not simply power down in safe and accessible locations. There is not a passive or failsafe automatic shutdown mode for an array of marine seismic devices that are being dragged forward by a survey vessel. In fact, because of the momentum of the overall array and individual marine seismic devices of the array, it is not practical to simply stop a survey vessel since the individual marine seismic devices being towed would continue to move forward (particularly given the large inertia) creating a possibility of engagement within the array. In this same vein, if one or more marine seismic devices begin to fail, the underwater streamers towing the devices may become entangled and dive or sink to the seafloor at depths that could cause the marine seismic devices to implode as a result of the hydrostatic pressure, which could result in significant financial impact and loss.

As discussed above, once the array of marine seismic devices is assembled and deployed in a survey operation, the individual marine seismic devices must remain operational for weeks or months at a time, without recovery, until completion of the survey operation. Recovery of a marine seismic survey array and redeployment in the event of a failure of marine seismic devices can take days or weeks, causing significant financial losses and inconsistencies in the results of the survey.

In the prior art, operators are often forced to change individual dead batteries while the array is still being towed by deploying small workboats with operators onboard who will locate a marine seismic device with a dead battery within the moving array and manually replace the dead battery. Such a maneuver can be dangerous to the personnel performing the operation.

Thus, the benefits and improvements provided by the battery management system of the present disclosure can be appreciated. Because all the marine seismic devices of an array are operating in the same environment, taking advantage of the large population of marine seismic devices in the array provides for statistical comparisons that allow the identification of outliers in terms of battery usage. Moreover, when the sea state gets rough or other environmental conditions change and battery usage goes up (or down), it goes up (or down) for all the marine seismic devices in a similar manner. By using battery charge data from each individual marine seismic device communicated back to a central location via a communication link for aggregations, analysis, and statistical comparison, anomalous conditions of the batteries of individual marine seismic devices can be identified and recommendations for management and/or replacement of individual marine seismic devices or their batteries can be made such that the incidence of battery failure during a survey operation can be reduced or eliminated. Elimination of such failures also eliminates the issues, losses, dangers, and inconsistencies discussed above.

This disclosure describes a battery monitoring and control system for an array of deployed marine seismic devices, each marine seismic device incorporating a battery system and a battery monitoring device containing a charge monitoring or coulomb counting circuit to send individual battery performance data to the device electronics, a communication backbone whereby each marine seismic device can report individual battery performance data to a central location such as a manned or unmanned marine vessel or land-based command center, a central location with a processing station that receives individual battery performance data from many deployed marine seismic devices, an algorithm on the processing station that characterizes overall battery performance across the array of deployed marine seismic devices and compares battery performance data from each deployed marine seismic device to the array average to identify anomalous conditions within individual deployed marine seismic devices or battery systems, and a reporting function that alerts of overall battery performance of the array as well as anomalies with individual deployed marine seismic devices as compared to the array averages. In one or more embodiments, the identified anomaly is a deployed marine seismic device battery depletion rate that is excessive in comparison to other deployed marine seismic devices in the same array. In one or more embodiments, the identified anomaly is a battery system of a deployed marine seismic whose charge level is dropping at an excessive rate relative to the electrical load the deployed marine seismic device is placing on it. In one or more embodiments, the reporting function projects the expected remaining duration of battery life of every deployed marine seismic device in the array, given their measured rates of depletion. In one or more embodiments, the reporting system projects the expected remaining duration of battery life of the batteries in high-depletion deployed marine seismic devices, assuming those batteries were to be redeployed in normal-depletion marine seismic devices. In one or more embodiments, the algorithm is programmed to identify the completion date of the survey and generate an alert if the battery system of a given deployed marine seismic device is projected to deplete before the completion date of the survey. In one or more embodiments, the reporting function offers possible deployed marine seismic device or array configuration changes that will reduce the rate of battery depletion of the deployed marine seismic devices. In one or more embodiments, the reporting function provides an end-of-survey summary of remaining life of each battery system within an array of marine seismic devices that can be used to determine which marine seismic devices can be deployed in a subsequent survey based on the anticipated operational requirements of marine seismic devices to be utilized in the subsequent survey. In one or more embodiments, the algorithm contains a machine learning component that can adjust future battery life estimates of marine seismic devices based on the environmental conditions and survey configuration settings expected during the next marine survey.

Thus, a method for marine seismic data collection has been described. In one or more embodiments, the method includes deploying the plurality of marine seismic devices in a body of water as an array; for each of plurality of marine seismic devices, separately monitoring a condition of an onboard battery system of said marine seismic device utilizing a battery monitoring device disposed onboard the marine seismic device; transmitting to a central location remote from the array the battery data associated with the monitored battery system condition of the onboard battery system of each respective marine seismic device; analyzing the transmitted battery data associated with the monitored battery system condition of a plurality of marine seismic device; and identifying, based on the analysis of the transmitted battery data, a first condition anomaly in at least one of the plurality of marine seismic devices when compared to the transmitted battery data of the other marine seismic devices of the plurality of marine seismic devices. In one or more embodiments, the method includes receiving, by the central processor and from each of the plurality of marine seismic survey devices, the battery data associated with the power consumption of the battery system of each marine seismic survey device; utilizing the received battery data from the plurality of marine seismic devices to calculate a set of marine seismic survey device power consumption statistics associated with the plurality of marine seismic survey devices; comparing the battery data of each marine seismic survey device with the set of marine seismic survey device power consumption statics to evaluate each marine seismic survey device; and identifying, based on the comparison of the battery data of each marine seismic survey device with the set of marine seismic survey device power consumption statics, an anomaly associated with one or more marine seismic survey devices of the plurality of marine seismic survey devices. In one or more embodiments, the method includes deploying a multiplicity of marine seismic survey devices as an array; beginning a survey by operating the multiplicity of marine seismic survey devices in the array over a first period of time; for each marine seismic survey device, monitoring battery power consumption over the period of time; and calculating a set of marine seismic survey device power consumption statistics for the array over the first period of time based on the monitored power consumption of each marine seismic survey device. In one or more embodiments, the method includes deploying a first multiplicity of marine seismic survey devices in a first array; operating the first multiplicity of marine seismic survey devices in the first array over a period of time to collect seismic data; for each marine seismic survey device of the first multiplicity of marine seismic survey devices, monitoring battery power consumption over the period of time; calculating a set of marine seismic survey device power consumption statistics for the first array based on the monitored power consumption of each marine seismic survey device; retrieving the first multiplicity of seismic devices; identifying expected power consumption for marine seismic survey devices to be used in a second array based on operating parameters for second array; and assembling from the first multiplicity of marine seismic survey devices a second multiplicity of marine seismic devices for the second array. In one or more embodiments, the method includes deploying the plurality of devices in an array; for each of plurality of seismic devices, separately monitoring a condition of an onboard battery system of said seismic device utilizing a battery monitoring device disposed onboard the seismic device; transmitting to a central location remote from the array the battery data associated with the monitored battery system condition of the onboard battery system of each respective seismic device; analyzing the transmitted battery data associated with the monitored battery system condition of a plurality of seismic device; and identifying, based on the analysis of the transmitted battery data, a first condition anomaly in at least one of the plurality of seismic devices when compared to the transmitted battery data of the other seismic devices of the plurality of seismic devices. In one or more embodiments, the method includes receiving, by the central processor and from each of the plurality of seismic devices, the battery data associated with the power consumption of the battery system of each seismic device; utilizing the received battery data from the plurality of seismic devices to calculate a set of seismic survey device power consumption statistics associated with the plurality of seismic devices; comparing the battery data of each seismic device with the set of seismic device power consumption statics to evaluate each seismic survey device; and identifying, based on the comparison of the battery data of each seismic survey device with the set of seismic device power consumption statics, an anomaly associated with one or more seismic devices of the plurality of seismic devices. In one or more embodiments, the method includes deploying a multiplicity of seismic devices as an array of a seismic survey; beginning a survey by operating the multiplicity of seismic devices in the array over a first period of time; for each seismic device, monitoring battery power consumption over the period of time; and calculating a set of seismic device power consumption statistics for the array over the first period of time based on the monitored power consumption of each seismic device. In one or more embodiments, the method includes deploying a first multiplicity of seismic devices in a first array; operating the first multiplicity of seismic devices in the first array over a period of time to collect seismic data; for each seismic device of the first multiplicity of seismic devices, monitoring battery power consumption over the period of time; calculating a set of seismic device power consumption statistics for the first array based on the monitored power consumption of each seismic device of the multiplicity of seismic devices; retrieving the first multiplicity of seismic devices; identifying expected power consumption for seismic devices to be used in a second array based on operating parameters for a second array; and assembling from the first multiplicity of seismic devices a second multiplicity of seismic devices for the second array.

Any of the foregoing methods may include any one of the following, alone or in combination:

Each marine seismic device of the plurality of marine seismic devices is the same type of device.

Each marine seismic device of a first portion of the plurality of marine seismic devices is a first type of marine seismic device; wherein each marine seismic device of a second portion of the plurality of marine seismic devices is a second type of marine seismic device; and wherein the second type of marine seismic device is different from the first type of marine seismic device.

Analyzing the transmitted battery data comprises: averaging the transmitted battery data associated with the monitored battery system condition of the plurality of marine seismic devices; determining, based on the averaged battery data, an average condition of the battery systems of the plurality of marine seismic devices; determining, based on the average condition of the battery systems of the plurality of marine seismic devices, a threshold value for the battery system condition; and comparing the battery data associated with the battery system condition of the respective battery system of each marine seismic device with the average condition of the battery system of the plurality of marine seismic devices; wherein the identified condition anomaly is based on the battery system condition of the at least one marine seismic device being on an opposite side of the threshold condition as compared to a majority of the plurality of marine seismic devices.

Analyzing the transmitted battery data comprises: averaging the transmitted battery data associated with the monitored battery system condition of the first portion of the plurality of marine seismic devices; determining, based on the averaged battery data, an average value of the battery systems of the first portion of the plurality of marine seismic devices; determining, based on the average value of the battery system of the first portion of the plurality of marine seismic devices, a first threshold value for the battery system condition; and comparing the battery data associated with the battery system condition of the respective battery system of each marine seismic device of the first portion of the plurality of marine seismic devices with the average condition of the battery system of the first portion of the plurality of marine seismic devices; wherein the first portion of the plurality of marine seismic devices includes the at least one marine seismic device; and wherein the identified condition anomaly is based on the battery system condition of the at least one marine seismic device being ion an opposite side of the first threshold value as compared to a majority of the first portion of the plurality of marine seismic devices.

The condition of the respective battery system of each marine seismic device of the first portion of the plurality of marine seismic devices is a rate of depletion of the respective battery system; wherein the average value is an average rate of depletion of the battery systems of the first potion of the plurality of marine seismic devices; and wherein the first threshold is associated with the average rate of depletion of the battery systems of the first portion of the plurality of marine seismic devices.

The first portion of the plurality of marine seismic devices includes the at least marine seismic device; and wherein the method further comprises: estimating, based on the analysis of the transmitted battery data, the remaining battery life of the respective battery system of each marine seismic device of the first portion of the plurality of marine seismic devices, wherein the identification of the condition anomaly is based on the estimated remaining battery life of a first battery of the at least one marine seismic device being less than a duration of a future survey operation in which the at least one marine seismic device is to be deployed; and an estimated remaining battery life of the first battery of the at least one marine seismic device if the first battery were redeployed in a another marine seismic device.

Identifying, based on the analysis of the transmitted battery data, a second condition anomaly in a second marine seismic device of the plurality of marine seismic devices; wherein analyzing the battery data further comprises: averaging the transmitted battery data associated with the monitored battery system condition of the second portion of the plurality of marine seismic devices; determining, based on the averaged battery data, an average condition of the battery systems of the second portion of the plurality of marine seismic devices; determining, based on the average condition of the battery systems of the second portion of the plurality of marine seismic devices, a second threshold value of the battery system condition; and comparing the battery data associated with the battery system condition of the respective battery of each marine seismic device of the second portion of the plurality of marine seismic devices with the average condition of the battery system of the second portion of the plurality of marine seismic devices; wherein the second portion of the plurality of marine seismic devices includes the second marine seismic device; and wherein the identified second condition anomaly is based on the battery system condition of the second marine seismic device being on an opposite side of the second threshold value average as compared to a majority of the second portion of the plurality of marine seismic devices.

The condition of the respective battery system of each marine seismic device is a rate of depletion of the respective battery system.

The identified condition anomaly is based on the rate of depletion the battery system of the at least one marine seismic device; and wherein the threshold is associated with the rate of depletion of a battery system relative to a task being performed by each respective marine seismic device.

Estimating, based on the analysis of the transmitted battery data, an estimated remaining battery life for the respective battery system of each marine seismic device of the plurality of marine seismic devices.

Identifying a remaining time period until completion of a survey operation in which the plurality of marine seismic devices are deployed.

The identified condition anomaly is based on the estimated remaining battery life of the battery system of the at least one of the plurality of marine seismic devices being less than a remaining time period for completion of a survey operation in which the at least one marine seismic device is deployed; wherein the method further comprises generating an alert; and wherein the alert comprises an indication that the t battery life of the battery system of the at least one of the plurality of marine seismic devices will deplete before completion of the survey operation.

Generating, based on the average condition of the battery systems, an estimated remaining battery life for the respective battery systems of each marine seismic device of the plurality of marine seismic devices and a maximum deployment duration for the plurality of marine seismic devices in a future survey operation.

Servicing any marine seismic device of the plurality of marine seismic devices that is identified as having an estimate remaining battery life that is less than the maximum deployment duration of the future survey operation.

Estimating, using the central processor and based on the analysis of the transmitted battery data, the remaining battery life of battery system if the battery system were removed from a serviced marine seismic device of the plurality of marine seismic devices and redeployed in a third marine seismic device; wherein the serviced marine seismic device is the first type of marine seismic device; and wherein the third marine seismic device is the second type of marine seismic device.

The first type of marine seismic device depletes battery systems at a faster rate than the second type of marine seismic device.

Generating, based on the analysis of the transmitted battery data, a recommended survey configuration adjustment for the at least one marine seismic device of the plurality of marine seismic devices that will reduce the rate of depletion of the battery system of the at least one marine seismic device.

The identified condition anomaly is physical condition of the at least one marine seismic device of the plurality of marine seismic devices.

Receiving, by the central processor and from each of the plurality of marine seismic devices, the battery data associated with the power consumption of the battery system of each marine seismic device; utilizing the received battery data from the plurality of marine seismic devices to calculate a set of marine seismic device power consumption statistics associated with the plurality of marine seismic devices; comparing the battery data of each marine seismic device with the set of marine seismic device power consumption statics to evaluate each marine seismic device; identifying, based on the comparison of the battery data of each marine seismic device with the set of marine seismic device power consumption statics, an anomaly associated with one or more marine seismic devices of the plurality of marine seismic devices.

Utilizing the set of marine seismic device power consumption statistics of the multiplicity of marine seismic devices to identify individual marine seismic devices that are operating outside of a desired power consumption range as compared to the multiplicity of marine seismic devices.

Utilizing the set of marine seismic device power consumption statistics of the multiplicity of marine seismic devices to identify individual marine seismic devices that are malfunctioning.

Utilizing the set of marine seismic device power consumption statistics of the multiplicity of marine seismic devices to identify individual marine seismic devices that will not have sufficient battery power to complete the survey as compared to the multiplicity of marine seismic devices.

Removing marine seismic devices that fall outside the expected power consumption based on the calculated marine seismic device power consumption statistics of the first array; the method further comprising: deploying the second multiplicity of marine seismic devices in the second array; and operating the second multiplicity of marine seismic devices in the second array to collect seismic data.

The marine seismic device power consumption statistics are the average power consumption of the multiplicity of marine seismic devices within the first array.

Replacing the battery of each marine seismic device that falls outside the expected power consumption based on the marine seismic device power consumption statistics of the first array.

Utilizing the set of marine seismic device power consumption statistics of the multiplicity of marine seismic devices to identify individual marine seismic devices that have a malfunctioning control mechanism.

Utilizing the set of marine seismic device power consumption statistics of the multiplicity of marine seismic devices to identify individual marine seismic devices that have a malfunctioning battery system.

Likewise, a battery monitoring system for a deployed marine seismic survey array has been described. The battery monitoring system includes a plurality of the marine seismic devices, each marine seismic device comprising an onboard battery system and an onboard battery monitoring device configured to monitor power consumption of the battery system and generate battery data associated with the power consumption of the battery system; and a central processor positioned remote from the plurality of marine seismic devices, wherein the central processor executes a plurality of instructions stored on a non-transitory computer readable medium so that the steps of any one of the foregoing methods are executed. The plurality of instructions can include any one of the foregoing method for marine seismic data collection, alone or in combination.

It is understood that variations may be made in the foregoing without departing from the scope of the present disclosure.

In several embodiments, the elements and teachings of the various embodiments may be combined in whole or in part in some or all of the embodiments. In addition, one or more of the elements and teachings of the various embodiments may be omitted, at least in part, and/or combined, at least in part, with one or more of the other elements and teachings of the various embodiments.

Any spatial references, such as, for example, "upper," "lower," "above," "below," "between," "bottom," "vertical," "horizontal," "angular," "upwards," "downwards," "side-to-side," "left-to-right," "right-to-left," "top-to-bottom," "bottom-to-top," "top," "bottom," "bottom-up," "top-down," etc., are for the purpose of illustration only and do not limit the specific orientation or location of the structure described above.

In several embodiments, while different steps, processes, and procedures are described as appearing as distinct acts, one or more of the steps, one or more of the processes, and/or one or more of the procedures may also be performed in different orders, simultaneously and/or sequentially. In several embodiments, the steps, processes, and/or procedures may be merged into one or more steps, processes and/or procedures.

In several embodiments, one or more of the operational steps in each embodiment may be omitted. Moreover, in some instances, some features of the present disclosure may be employed without a corresponding use of the other features. Moreover, one or more of the embodiments disclosed above, or variations thereof, may be combined in whole or in part with any one or more of the other embodiments described above, or variations thereof.

Although several embodiments have been described in detail above, the embodiments described are illustrative only and are not limiting, and those skilled in the art will readily appreciate that many other modifications, changes and/or substitutions are possible in the embodiments without materially departing from the novel teachings and advantages of the present disclosure. Accordingly, all such modifications, changes, and/or substitutions are intended to be included within the scope of this disclosure as defined in the following claims. In the claims, any means-plus-function clauses are intended to cover the structures described herein as performing the recited function and not only structural equivalents, but also equivalent structures. Moreover, it is the express intention of the applicant not to invoke 35 U.S.C. § 112(f) for any limitations of any of the claims herein, except for those in which the claim expressly uses the word "means" together with an associated function.

What is claimed is:

1. A method for marine seismic data collection, comprising:

deploying a first multiplicity of marine seismic devices in a first array, each marine seismic device having positioned onboard a respective battery system and a respective battery monitoring device;

operating the first multiplicity of marine seismic devices in the first array in accordance with a first marine seismic survey plan so as to place a first load on each respective battery system;

monitoring, using each respective battery monitoring device while operating the first multiplicity of marine seismic devices, a battery discharge rate of each respective battery system;

determining, using the monitored battery discharge rate of each respective marine seismic device, a discharge rate range associated with the first multiplicity of marine seismic devices;

retrieving the first multiplicity of marine seismic devices;

assembling, using at least a portion of the first multiplicity of marine seismic devices based on the determined discharge rate range, a second multiplicity of marine seismic devices for a second array;

deploying the second multiplicity of marine seismic devices in the second array in accordance with a second marine seismic survey plan; and operating the second multiplicity of marine seismic devices in the second array in accordance with the second marine seismic survey plan so as to place a second load on each respective battery system.

2. The method of claim 1, wherein assembling the second multiplicity of marine seismic devices comprises removing one or more marine seismic devices of the first multiplicity of marine seismic devices having monitored battery discharge rates that fall outside the determined discharge rate range associated with the first multiplicity of marine seismic devices.

3. The method of claim 2, wherein the remaining marine seismic devices of the first multiplicity of marine seismic devices, having monitored battery discharge rates that fall within the determined discharge rate range, are used to assemble the second multiplicity of marine seismic devices for the second array.

4. The method of claim 1, further comprising:

identifying one or more marine seismic devices from the first multiplicity of marine seismic devices having monitored battery discharge rates that fall outside the determined discharge rate range; and replacing the respective batteries of each of the one or more marine seismic devices identified as having monitored battery discharge rates that fall outside the determined discharge rate range;

wherein the one or more marine seismic devices, the respective batteries of which have been replaced, are used to assemble the second multiplicity of marine seismic devices for the second array.

5. The method of claim 1, further comprising:

determining, using the monitored battery discharge rate of each respective battery system, an estimated remaining battery life of each respective marine seismic device of the first multiplicity of marine seismic devices;

wherein assembling the second multiplicity of marine seismic devices comprises removing one or more marine seismic devices of the first multiplicity of marine seismic devices having estimated remaining battery lives less than a maximum operation duration associated with the second marine seismic survey plan.

6. The method of claim 1, further comprising:

determining, using the monitored battery discharge rate of each respective battery system of each respective marine seismic device of the first multiplicity of marine seismic devices, an estimated remaining battery capacity of each respective marine seismic device of the first multiplicity of marine seismic devices;

wherein assembling the second multiplicity of marine seismic devices comprises removing one or more marine seismic devices of the first multiplicity of marine seismic devices having estimated remaining battery capacities less than an expected battery capacity depletion associated with the second marine seismic survey plan.

7. A method for marine seismic data collection, comprising:

deploying a first multiplicity of marine seismic devices in a first array, each marine seismic device having positioned onboard a respective battery system and a respective battery monitoring device;

operating the first multiplicity of marine seismic devices in the first array in accordance with a first marine seismic survey plan so as to place a first load on each respective battery system;

monitoring, using each respective battery monitoring device while operating the first multiplicity of marine seismic devices, a battery discharge rate of each respective battery system;

retrieving the first multiplicity of marine seismic devices;

determining, using the monitored discharge rate of each respective battery system of the first multiplicity of marine seismic devices, an estimated remaining battery life of each respective battery system of the first multiplicity of marine seismic devices;

assembling, from the first multiplicity of marine seismic devices based on the estimated remaining battery life of each respective battery system of the first multiplicity of marine seismic devices, a second multiplicity of marine seismic devices for a second array;

deploying the second multiplicity of marine seismic devices in the second array in accordance with a second marine seismic survey plan; and operating the second multiplicity of marine seismic devices in the second array in accordance with the second marine seismic survey plan so as to place a second load on each respective battery system.

8. The method of claim 7, further comprising:

identifying a maximum duration associated with the operation of the second multiplicity of marine seismic devices in accordance with the second marine seismic survey plan;

wherein assembling the second multiplicity of marine seismic devices comprises removing one or more marine seismic devices of the first multiplicity of marine seismic devices having estimated remaining battery lives less than the identified maximum duration associated with the operation of the second multiplicity of marine seismic devices in accordance with the second marine seismic survey plan.

9. The method of claim 7, wherein the first multiplicity of marine seismic devices comprises a first portion of marine seismic devices of a first type and a second portion of marine seismic devices of a second type that is different from the first type.

10. The method of claim 9, determining, using the monitored discharge rate of each respective battery system of the first portion of the first multiplicity of marine seismic devices, an average battery discharge rate associated with the first type of marine seismic device; and determining, using the monitored discharge rate of each respective battery system of the second portion of the first multiplicity of marine seismic devices, an average battery discharge rate associated with the second type of marine seismic device;

wherein the average battery discharge rate associated with the first type of marine seismic device is greater than the average battery discharge rate associated with the second type of marine seismic device.

11. The method of claim 9, further comprising:

identifying a maximum duration associated with the operation of the second multiplicity of marine seismic devices in accordance with the second marine seismic survey plan; and identifying one or more marine seismic devices of the first portion of the first multiplicity of marine seismic devices having estimated remaining battery lives less than the identified maximum duration associated with the second marine seismic survey plan.

12. The method of claim 11, further comprising:

determining, using the monitored discharge rate of each respective battery system of the second portion of the first multiplicity of marine seismic devices, that an estimated remaining battery life of each battery system of the identified one or more marine seismic devices would be greater than the identified maximum duration associated with the second marine seismic survey plan if each battery system of the identified one or more marine seismic devices were redeployed in the second type of marine seismic device in the second array;

wherein assembling the second multiplicity of marine seismic devices for the second array comprises redeploying each battery system of the identified one or more marine seismic devices in the second type of marine seismic device for the second array.

13. The method of claim 11, further comprising:

determining, using the monitored discharge rate of each respective battery system of the second portion of the first multiplicity of marine seismic devices, that an estimated remaining battery life of each battery system of the identified one or more marine seismic devices would be less than the identified maximum duration associated with the second marine seismic survey plan if each battery system of the identified one or more marine seismic devices were deployed in the second type of marine seismic device in the second array;

wherein assembling the second multiplicity of marine seismic devices for the second array comprises removing each battery system of the identified one or more marine seismic devices having estimated remaining battery lives less than the identified maximum duration associated with the second marine seismic survey plan.

14. A method for marine seismic data collection, comprising:

operating a plurality of marine seismic devices, each powered by a battery system positioned onboard each respective marine seismic device, in a first seismic survey operation;

monitoring, during the first seismic survey operation and using a battery monitoring device positioned onboard each respective marine seismic device, a battery discharge value associated with each respective battery system;

determining, using a central processor remote from the plurality of marine seismic devices and first battery data associated with the monitored battery discharge values, an estimated remaining battery life of each respective battery system after completion of the first seismic survey operation;

identifying, using the central processor, an operation parameter associated with a second seismic survey operation, the operation parameter defining an expected deployment duration and an expected battery depletion rate;

determining, using the central processor and based on a comparison of the estimated remaining battery lives and the expected battery depletion rate, an expected battery life utilization of each respective battery system during the second seismic survey operation;

making a redeployment decision for each respective battery system comprising determining, using the central processor and based on a comparison of the expected battery life utilization of each respective battery system during the second seismic survey operation and the expected deployment duration associated with the second seismic survey operation, whether each respective battery system should be:

redeployed in the respective marine seismic device in the second seismic survey operation; or replaced prior to operation of the plurality of marine seismic devices in the second seismic survey operation; and operating the plurality of marine seismic devices in the second seismic survey operation.

15. The method of claim 14, wherein determining the estimated remaining battery life of each respective battery system comprises:

aggregating the first battery data associated with the respective battery discharge values;

determining an average battery discharge value associated with the plurality of marine seismic devices; and identifying one or more battery systems having battery discharge values that deviate from the average battery discharge value by more than a predefined threshold, wherein the estimated remaining battery life of each of the identified one or more battery systems is adjusted based on the respective deviation of the respective battery discharge value from the average battery discharge value.

16. The method of claim 14, wherein the central processor executes a machine learning model trained on historical battery data and historical operation parameters to improve the accuracy of the expected battery depletion rate.

17. The method of claim 14, further comprising:

replacing one or more battery systems in response to one or more redeployment decisions comprising determinations that the one or more respective battery systems should be replaced prior to operation of the plurality of marine seismic devices in the second seismic survey operation.

18. The method of claim 14, further comprising:

determining, in response to one or more redeployment decisions comprising determinations that one or more respective battery systems should be replaced prior to operation of the plurality of marine seismic devices in the second seismic survey operation, whether each of the one or more respective battery systems would be suitable for redeployment for the second seismic survey operation in one or more marine seismic devices of the plurality of marine seismic devices that is a different type of device from the respective marine seismic device in which each of the one or more respective battery systems was deployed for the first seismic survey operation.

19. The method of claim 18, further comprising:

redeploying for the second seismic survey operation the one or more respective battery systems in the one or more marine seismic devices of the plurality of marine seismic devices that is a different type of device from the respective marine seismic device in which each of the one or more respective battery systems was deployed for the first seismic survey operation.

20. The method of claim 14, further comprising:

displaying, via a graphical user interface associated with the central processor, the redeployment decisions for each respective battery system.

21. A method for marine seismic data collection, comprising:

deploying a first multiplicity of marine seismic devices in a first array, each marine seismic device having positioned onboard a respective battery system;

operating the first multiplicity of marine seismic devices in the first array in accordance with a first marine seismic survey plan so as to place a first load on each respective battery system;

monitoring a battery discharge rate of each respective battery system;

determining, using the monitored battery discharge rate of each respective marine seismic device, a discharge rate range associated with the first multiplicity of marine seismic devices;

retrieving the first multiplicity of marine seismic devices;

assembling, using at least a portion of the first multiplicity of marine seismic devices based on the determined discharge rate range, a second multiplicity of marine seismic devices for a second array;

deploying the second multiplicity of marine seismic devices in the second array in accordance with a second marine seismic survey plan; and operating the second multiplicity of marine seismic devices in the second array in accordance with the second marine seismic survey plan so as to place a second load on each respective battery system.

* * * * *